United States Patent
Soo et al.

(12)

(10) Patent No.: US 6,251,798 B1
(45) Date of Patent: Jun. 26, 2001

(54) FORMATION OF AIR GAP STRUCTURES FOR INTER-METAL DIELECTRIC APPLICATION

(75) Inventors: Choi Pheng Soo, Johor (MY); Kheng Chok Tee; Kok Keng Ong, both of Singapore (SG); Lap Chan, San Francisco, CA (US)

(73) Assignees: Chartered Semiconductor Manufacturing Company; National University of Singapore; Nanyang Technological University of Singapore, all of Singapore (SG)

( * ) Notice: Subject to any disclaimer, the term of this patent is extended or adjusted under 35 U.S.C. 154(b) by 0 days.

(21) Appl. No.: 09/359,894

(22) Filed: Jul. 26, 1999

(51) Int. Cl.[7] .......................... H01L 21/31; H01L 21/469
(52) U.S. Cl. .......................... 438/758; 438/400; 438/421; 438/619
(58) Field of Search .................................. 438/758, 289, 438/305, 382, 400, 421, 619, 624

(56) References Cited

U.S. PATENT DOCUMENTS

| 5,372,969 | 12/1994 | Moslehi | 437/195 |
| 5,461,003 | * 10/1995 | Havemann et al. | |
| 5,468,685 | 11/1995 | Orisaka et al. | 437/228 |
| 5,510,293 | 4/1996 | Numata | 437/195 |

* cited by examiner

Primary Examiner—Kevin M. Picardat
Assistant Examiner—D. M. Collins
(74) Attorney, Agent, or Firm—George O. Saile; Rosemary L.S. Pike

(57) ABSTRACT

A method for the formation of an air gap structure for use in inter-metal applications. A metal pattern of metal lines is formed, a layer of Plasma Polymerized Methylsilane (PPMS) resist is deposited on top of this pattern. The surface of the PPMS resist is subjected to selective exposure. The unexposed PPMS is removed after which the process is completed by closing up the openings within the PPMS.

29 Claims, 2 Drawing Sheets

FORMATION OF AIR GAP STRUCTURES FOR INTER-METAL DIELECTRIC APPLICATION

BACKGROUND OF THE INVENTION

(1) Field of the Invention

The invention relates to the fabrication of Integrated Circuit devices, and more specifically to Plasma Enhanced Chemical Vapor Deposition (PECVD) Plasma Polymerized Methylsilane (PPMS) processing and the formation of air gaps as a low dielectric constant material between conductor lines.

(2) Description of the Prior Art

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The continuing effort to reduce the size of individual transistors and other devices commonly integrated on a semiconductor chip and to increase the density of Integrated Circuits results in a continuing reduction of the separation between conducting layers of materials. This reduction results in an increase of capacitive crosstalk between adjacent conductor lines of a semiconductor circuit, that is the voltage on the first conductor line alters or affects the voltage on the second conductor line. This alteration in voltage can cause erroneous voltage levels in the Integrated Circuit making the IC increasingly prone to faulty operation. It becomes therefore imperative to reduce the resistive capacitance (RC) time constant and the crosstalk between adjacent conducting lines.

The capacitance between adjacent conducting lines is highly dependent on the insulator or dielectric used to separate the conducting lines. Conventional semiconductor fabrication typically uses silicon dioxide as a dielectric; this has a dielectric constant of about 3.9.

The use of many of the low dielectric constant materials is not feasible due to the fact that equipment is not available to properly process the new dielectric material in various integrated circuits. Also, the chemical or physical properties of many low dielectric constant materials are usually difficult to make compatible with or integrate into conventional integrated circuit processing.

The lowest possible and therefore the ideal dielectric constant is 1.0, this is the dielectric constant of a vacuum whereas air has a dielectric constant of less that 1.001.

To reduce said capacitive coupling and reduce the capacitive crosstalk, a major objective in the design of IC's is to reduce the Dielectric Constant (k) of the insulating layer between adjacent conductor lines of semiconductor circuits. The present invention makes a significant contribution within the scope of this effort.

U.S. Pat. No. 5,461,003 (Haveman et al.) shows a method of forming air gaps between metal lines by: 1) forming a photoresist layer (disposable layer) 18 (see table 1) between and over metal lines; 2) forming a low-k dielectric (PPMA) (20 see table 1) (but not by having openings thereover); 3) removing the PPMA 18 and thereby forming air gaps and 4) by forming a capping oxide layer to close up the air gaps. However, this patent differs from the present invention.

U.S. Pat. No. 5,510,293 (Numate) and U.S. Pat. No. 5,372,969 (Moslehi) show air gap processes.

U.S. Pat. No. 5,468,685 (Orisaka et al.) shows a porous dielectric layer.

SUMMARY OF THE INVENTION

The principal object of the present invention is to provide an effective and manufacturable method of forming air gaps between conductive layers of material.

Another objective of the present invention is a method of reducing the dielectric constant k between conductive layers of material.

Another objective of the present invention is a method of reducing capacitive coupling between conducting layers of material.

Another objective of the present invention is a method of reducing capacitive crosstalk between conductive layers of material.

Another objective of the present invention is to reduce the potential for false or incorrect logic levels of the circuits in the IC's.

Another objective of the present invention is a method of reducing Resistive Capacitive delays of the circuits in the IC's.

Another objective of the present invention is to increase Switching Speed of the circuits in the IC's.

In accordance with the objects of the present invention a new method of forming air gaps between adjacent conducting lines of a semiconductor circuit is achieved.

A metal pattern of metal lines is in the standard manner deposited on a semiconductor substrate. A layer of Plasma Polymerized Methylsilane (PPMS) resist is deposited on top of this pattern using Plasma Enhanced Chemical Vapor Deposition (PECVD). Chemical Mechanical Polarization (CMP) is performed to achieve planarity of the deposited PPMS resist. This step is optional.

A reticle is interposed between a source of radiation and the surface of the created PPMS resist. The surface of the PPMS resist is subjected to deep ultraviolet (UV) exposure (with radiation wavelength of 193 nm., 248 nm., etc.) or by E-beam radiation. The exposure depth is controlled during this exposure. The surface of the PPMS resists is selectively (via the reticle) exposed, the PPMS is bleached or exposed down to slightly below the top of the metal lines, the PPMS is in this manner converted to PPMSO. Columns of unexposed PPMS are created in the areas that are protected or shielded by the reticle. The PPMS is removed by normal polymer remove methods such as oxygen plasma. The process is completed by closing up the openings between the PPMSO columns by oxide CVD across the surface of the structure.

DETAILED DESCRIPTION OF THE PREFERRED EMBODIMENT

The making and use of the presently preferred embodiment of the present invention is discussed below. However, it should be appreciated that the present invention provides many applicable inventive concepts that can be combined with a variety of specific contexts. The specific embodiment discussed here is merely illustrative of specific ways to make and use the present invention and does not delimit the scope of the invention.

Figure 1:
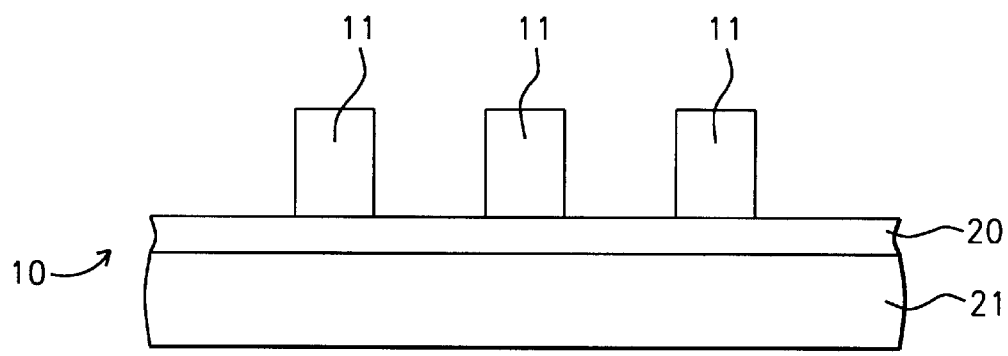
FIG. 1 shows the deposited pattern of metal lines.

Referring now more specifically to FIG. 1, there is shown a cross-sectional view of a semiconductor wafer 10 having a substrate 21, which may, for example, contain transistors, diodes and other semiconductor elements (not shown), as are well known in the art. The substrate 21 may also contain metal interconnect layers. The substrate 21 is, preferably, made of silicon, which is typically single crystalline. The substrate can also be made of gallium arsenide, silicon on sapphire, epitaxial formations, germanium, germanium silicon, diamond, silicon on insulator material and/or similar substrate materials. The base layer 20 has been deposited over the substrate 21 and contains silicon dioxide. The base layer can also contain other dielectric materials.

In general, base layer 20 illustrates that the present invention of forming air gaps between adjacent conducting lines of a semiconductor circuit may be applied on any level within the integrated circuit.

FIG. 1 shows the metal conductive lines 11 after deposition onto the base layer 20. In the preferred form, the regions 11 are conductive lines such as metal, a silicate, a salicide, poly silicon, amorphous silicon or any other semiconductor compatible conductive layer. This cross-section can indicated any level of conducting lines that needs to be isolated and is etched in a predetermined pattern to form metal leads.

Figure 2:
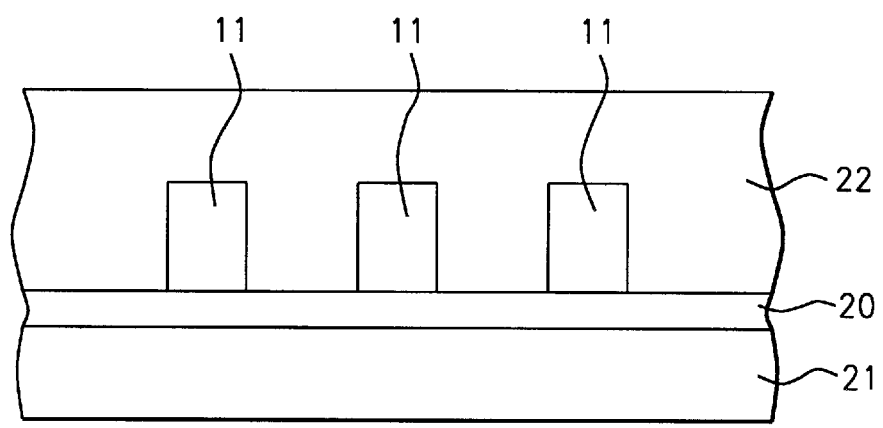
FIG. 2 shows the formation of PPMS across the deposited metal lines.

FIG. 2 shows the results of the Plasma Enhanced Chemical Vapor Deposition (PECVD) process in forming PPMS layer 22. It is to be noted that the PPMS is formed as a layer across the surface of the previously deposited metal lines 11 and also penetrates between these lines. The deposited PPMS serves as a filler material as used within the context of the present invention. The method of deposition is not critical and can be Physical Vapor Deposition (PVD), Chemical Vapor Deposition (CVD), spin-on material, etc. The PPMS layer may, for example, be spun onto the wafer at a slow speed to a height of approximately two times the height of the metal leads in order to fill all spaces between the metal lines 11 with the filler material.

PPMS can be deposited from methylsilicane in a 13,56 MHz rf powered parallel plate reactor. The methylsilicane is delivered at a flow rate of 50 SCCM. The thickness of the layer of deposited PPMS will depend on the spacing between the metal lines, typically greater than 5000 Angstrom but not exceeding 10,000 Angstrom.

Figure 3:
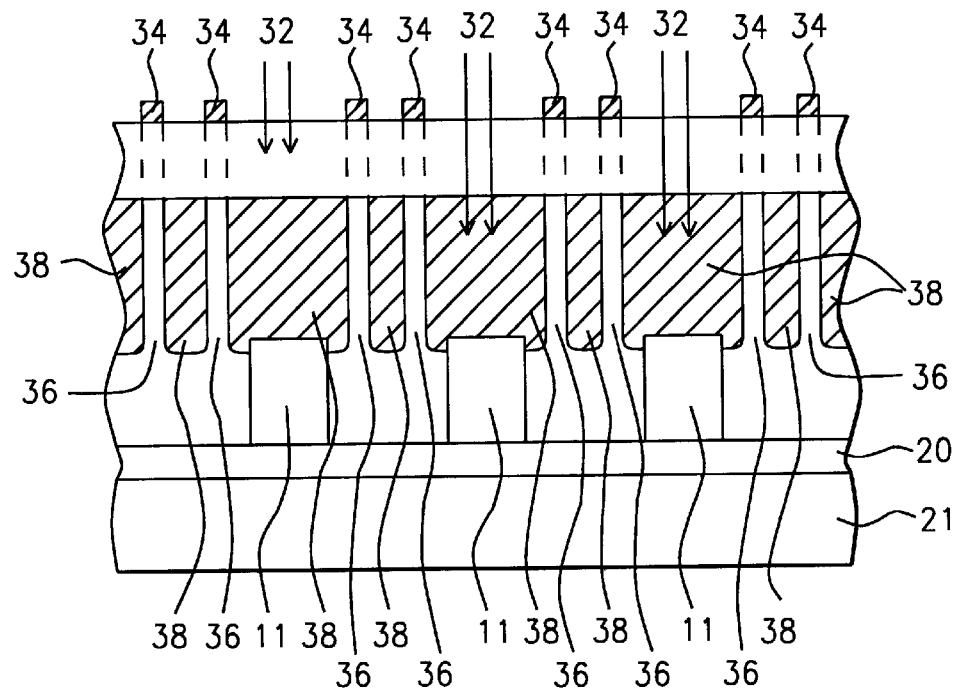
FIG. 3 shows the formation of the PPMSO columns.

FIG. 3 shows the application of radiation 32 to the top surface 38 of the deposited layer 22 of PPMS. The reticle 34 interrupts or blocks the exposure 32 in a predetermined pattern such that areas 38 between the deposited metal lines 11 PPMS resist are exposed. The columns 38 formed in this manner are typically from 0.15 um. to 0.30 um. wide. The spacings between the columns are typically not less than 0.15 um. The PPMS originally contained within columns 38 are, as a result of exposure 32, converted to PPMSO.

The wavelength of exposure 32 can be 248 nm. KrF or 193 nm. ArF. The exposure dose or density can be approximately 20 $mJ/cm^2$ for a width of columns 38 of 0.20 um.

PPMS, when used as a negative resist, undergoes photo oxidation during UV exposure in air. PPMS will form PPMSO, a siloxane network structure in the exposed areas. These exposed areas have etch properties similar to $SiO_2$. The PPMS film exhibits an intense, broad UV absorption band above 300 nm. as is characteristic of material with a Si or Si-bond framework. It is this intense UV absorption band that accounts for the sensitivity of thin PPMS films at both 193 and 248 nm. The PPMSO, formed upon UV exposure, is similar to $SiO_2$ and hence can remain after the polymer removal step. The PPMS (the unexposed area) will be etched away during polymer removal step.

Using these PPMS characteristics the so-called 'PPMS columns' 36 are formed. The areas 36 of the deposited PPMS resist that are not exposed remain unaffected by the exposure. In the areas 38 of the PPMS that are exposed the PPMS is bleached or converted to PPMS Oxide (PPMSO). It must be noted that the PPMS columns together with the air gap columns 36 are positioned between the previously deposited metal lines 11. It must be emphasized that the exposed regions of the PPMS, the regions that are (due to the exposure) converted to PPMSO, remain in place during the process of the invention. These regions are highlighted and referred to as regions 40 in the following FIG. 4.

After the process of exposure of the PPMS resist as indicated in FIG. 3 is completed, the unexposed PPMS is removed (not shown) by using polymer removal step. It is required to be an isotropic etch, that is the etching must proceed in all directions at the same rate.

Figure 4:
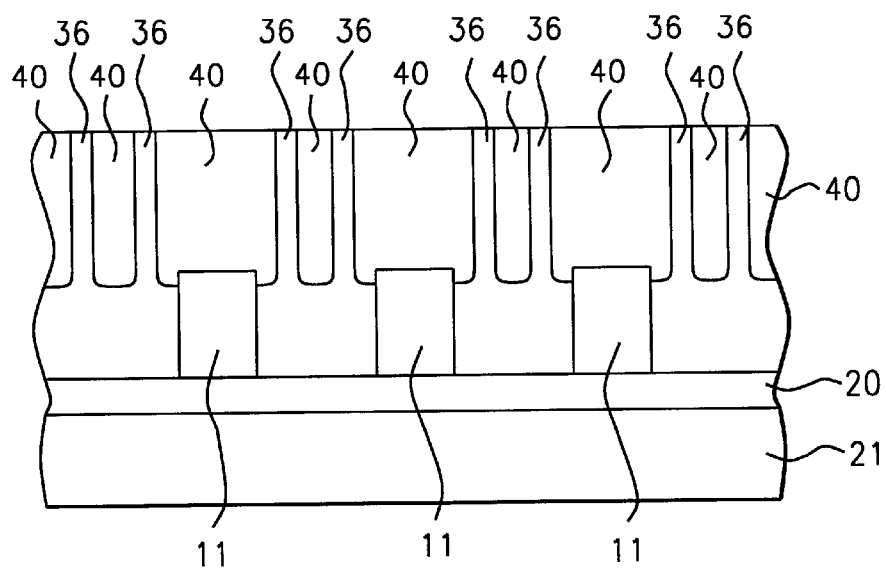
FIG. 4 shows the removal of the PPMS thereby creating the air gaps.

FIG. 4 shows the cross section after the PPMS has been removed, this removal has opened the areas 36 of the exposed PPMS. The columns 36 form the air gaps within the semiconductor structure. FIG. 4 further shows a cross section of the regions 40 of PPMSO that remain in place after the completion of the process of the invention.

As a final step (not shown) in the formation of the required air gaps, an oxide layer is deposited in the conventional CVD manner in order to close the openings to the regions 36, these openings have been created by the removal of the PPMS.

While the present invention has been described with reference to an illustrative embodiment, this description is not to be construed in a limiting sense. Various modifications and combinations, as well as other embodiments of the invention will be apparent to those skilled in the art of semiconductor manufacturing and design upon reference to the description. It is therefore intended that the appended claims encompass any such modifications or embodiments.

What is claimed is:

1. A method for forming air gaps between conducting lines of a semiconductor device, comprising the steps of:

providing a semiconductor substrate on the surface of which a base layer has been created;

depositing a metal layer on said base layer;

etching said metal layer into a pattern to form metal leads, said metal leads having tops and sidewalls with a spacing or gap between said metal leads, wherein said base layer is exposed in areas of said gaps between said metal leads;

depositing a plasma resist layer on said metal leads and on said exposed portions of said base layer;

positioning a reticle;

positioning a source of radiation above said reticle in such a manner that said reticle selectively blocks radiation from areas of spacing or gaps between said metal leads;

exposing the surface of said plasma resist layer to radiation, said radiation partially passing through and partially being intercepted by said reticle, creating unexposed plasma resist that aligns with said gaps between said metal leads;

controlling depth of said exposure such that said exposure does not penetrate below said surface of said metal lines;

removing unexposed plasma resist material, creating openings in said layer of plasma resist that align with said gaps between said metal leads; and closing openings created by removal of said unexposed plasma resist material.

2. The method of claim 1 further comprising the step of forming a passivating layer on the sidewalls of said metal leads, after said step of etching said metal layer in a pattern to form metal leads.

3. The method of claim 1 further comprising the step of forming a passivating layer between said metal leads and on top of said exposed portion of said base layer in addition to a passivating layer on the sidewalls of said metal leads, after said step of etching said metal layer in a pattern to form metal leads.

4. The method of claim 1 wherein said plasma resist contains Plasma Polymerized Methylsilane (PPMS).

5. The method of claim 1 wherein said plasma resist deposition occurs via Physical Vapor Deposition.

6. The method of claim 1 wherein said plasma resist deposition occurs via Chemical Vapor Deposition.

7. The method of claim 1 wherein said plasma resist deposition occurs via material spin-on.

8. The method of claim 1 wherein said depositing said plasma resist is depositing from methylsilane in a 13,56 MHz rf powered parallel plate reactor wherein said methylsilane is delivered at a flow rate of 45 to 55 SCCM.

9. The method of claim 1 wherein said plasma resist layer is from 100 nm. to 300 nm. thick.

10. The method of claim 1 wherein the method of exposing said PPMS resist is based on high-energy particle beam technology.

11. The method of claim 1 wherein the method of exposing said PPMS resist is based on photo-optic technology.

12. The method of claim 1 wherein the method of exposing said PPMS resist is based on thermal heating technology.

13. The method of claim 1 wherein the method of exposing said PPMS resist is based on ultraviolet radiation technology.

14. The method of claim 2 wherein said passivating layer comprises a silicon nitride.

15. The method of claim 3 wherein said passivating layer comprises a silicon nitride.

16. The method of claim 1 further comprising the step of depositing a structural dielectric layer, after said step of removing said unexposed PPMS resist.

17. The method of claim 1 wherein said plasma consists of a chloride based plasma.

18. The method of claim 1 wherein said plasma consists of an oxide based plasma.

19. The method of claim 1 wherein closing the openings created by the removal of said exposed plasma resist material is performed using oxide CVD.

20. The method of claim 1 wherein removing said unexposed plasma resist is by polymer removal step such as oxygen plasma.

21. The method of claim 1 wherein said exposing the top surface of said plasma is exposing with a wavelength of 248 nm KrF or 193 nm ArF whereby the exposure density is 20 mJ/cm$^2$ whereby the exposed opening width is 0.20 um.

22. The method of claim 1 wherein said substrate contains silicon.

23. The method of claim 1 wherein said reticle only exposes all areas above said metal lines wherein said reticle further partially blocks said areas of spacing or gaps between said metal lines.

24. A structure of air gaps between conducting lines of a semiconductor device, comprising:

a semiconductor substrate on the surface of which a base layer has been created;

a pattern of conducting interconnect lines created on the surface of said base layer, said conducting interconnect lines having tops and sidewalls with a spacing or gap between said conducting interconnect lines, said spacing partially exposing the surface of said base layer; and a plasma resist layer deposited overlying said conducting interconnect lines and overlying said partially exposed portions of said base layer, said plasma resist layer having been removed from between said conducting interconnect lines creating gaps between said conducting interconnect lines, whereby furthermore said plasma resist layer has been selectively removed in regions of said plasma resist layer that overly and align with said gaps between said interconnect lines.

25. The structure of air gaps of claim 24 further comprising a passivating layer on the sidewalls of said metal leads.

26. The structure of air gaps of claim 24 further comprising a passivating layer between said metal leads and on top of said partially exposed base layer in addition to a passivating layer on the sidewalls of said metal leads.

27. The structure of air gaps of claim 24 wherein said plasma resist comprises Plasma Polymerized Methylsilane (PPMS).

28. The structure of air gaps of claim 24 wherein said plasma resist layer is from 100 nm. to 300 nm. thick.

29. The structure of air gaps of claim 24 further comprising a structural dielectric layer created over the surface of said plasma resist layer.

* * * * *